(12) United States Patent
Sato et al.

(10) Patent No.: US 8,630,070 B2
(45) Date of Patent: Jan. 14, 2014

(54) MAGNETIC HEAD

(75) Inventors: Rie Sato, Yokohama (JP); Koichi Mizushima, Kamakura (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 94 days.

(21) Appl. No.: 13/207,802

(22) Filed: Aug. 11, 2011

(65) Prior Publication Data

US 2012/0075752 A1    Mar. 29, 2012

(30) Foreign Application Priority Data

Sep. 28, 2010   (JP) .................... 2010-217598

(51) Int. Cl.
   *G11B 5/33*   (2006.01)

(52) U.S. Cl.
   USPC ............. 360/324; 360/324.1; 360/324.11; 360/324.12

(58) Field of Classification Search
   USPC ........... 360/324, 313, 324.1, 324.11–324.12, 360/324.2
   See application file for complete search history.

(56) References Cited

U.S. PATENT DOCUMENTS

| 7,602,588 B2 * | 10/2009 | Sato et al. ............. 360/324 |
| 2008/0304176 A1 * | 12/2008 | Takagishi et al. ...... 360/86 |
| 2009/0080109 A1 * | 3/2009 | Fukuzawa et al. ...... 360/122 |
| 2011/0280340 A1 * | 11/2011 | Pasanen et al. ........ 375/300 |

FOREIGN PATENT DOCUMENTS

| JP | 7-326006 A | 12/1995 |
| JP | 2007-124340 A | 5/2007 |
| JP | 2008-084482 A | 4/2008 |
| JP | 2008-123669 A | 5/2008 |
| JP | 2009-080904 A | 4/2009 |
| WO | WO 2011/020339 A1 | 3/2011 |

OTHER PUBLICATIONS

Japanese Office Action dated Aug. 21, 2012 from corresponding JP Application No. 2010-217598, 8 pages.

* cited by examiner

*Primary Examiner* — Hoa T Nguyen
*Assistant Examiner* — Carlos E Garcia
(74) *Attorney, Agent, or Firm* — Ohlandt, Greeley, Ruggiero & Perle, L.L.P.

(57) ABSTRACT

According to one embodiment, there is provided a magnetic head for a three-dimensional magnetic recording/reproducing apparatus, the head executing reading from or writing to a recording medium, utilizing a magnetic resonance, the medium including stacked layers formed of magnetic substances having different resonance frequencies, the head comprising a spin torque oscillation unit and auxiliary magnetic poles. The unit is operable to simultaneously oscillate at a plurality of frequencies to cause the magnetic resonance, when reading or writing. The magnetic poles assist the unit, when reading or writing. Further, according to another embodiment, there is provided a recording magnetic head using a high-frequency assist method and comprising a microwave magnetic field applying unit and a recording magnetic pole. The unit executes writing to a recording medium, and is formed of a plurality of spin torque oscillation elements having phases thereof synchronized. The magnetic pole assists the writing.

6 Claims, 13 Drawing Sheets

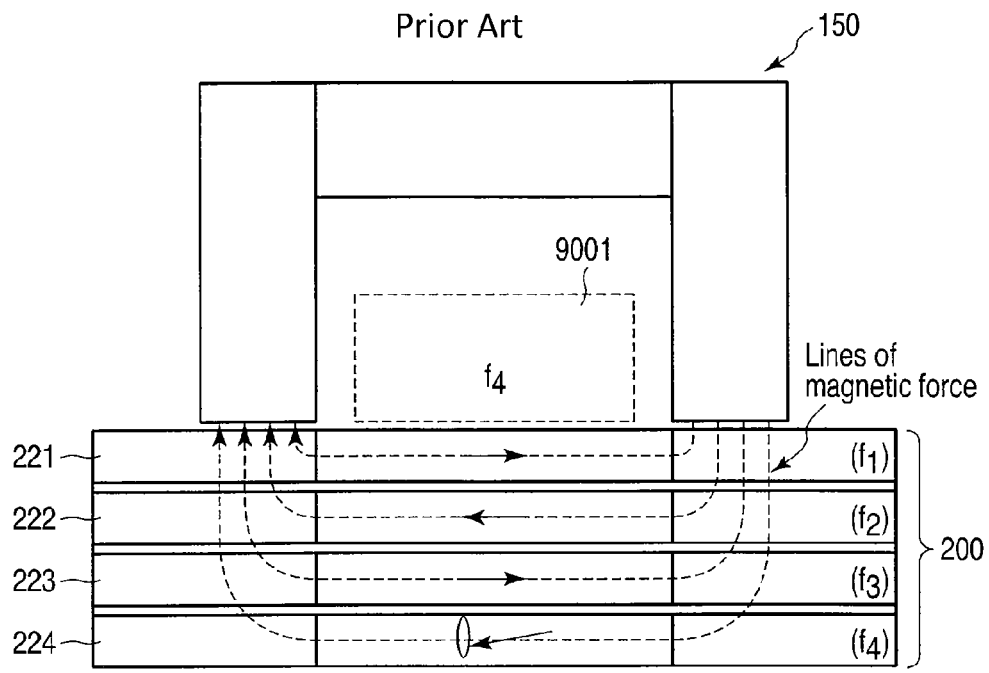
F I G. 4
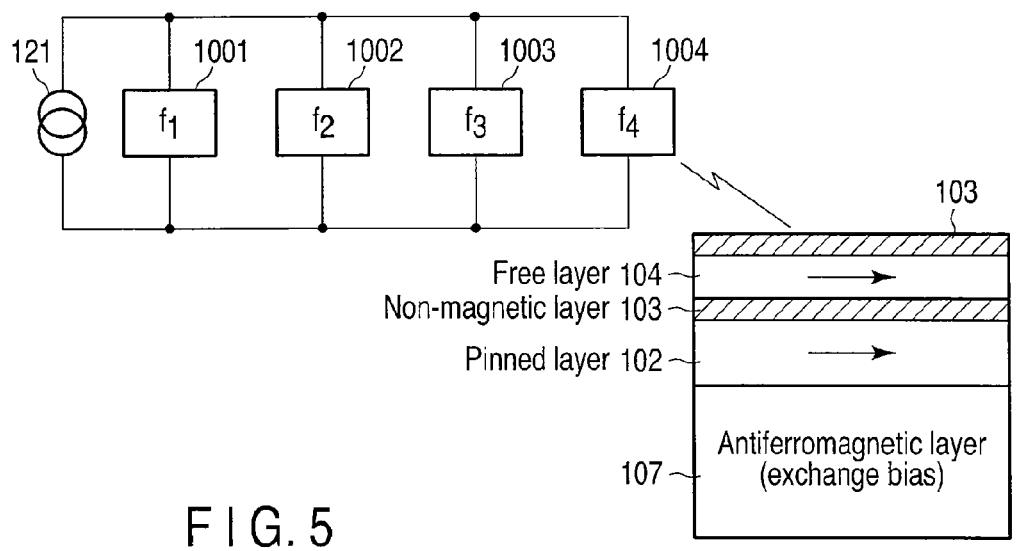
F I G. 5

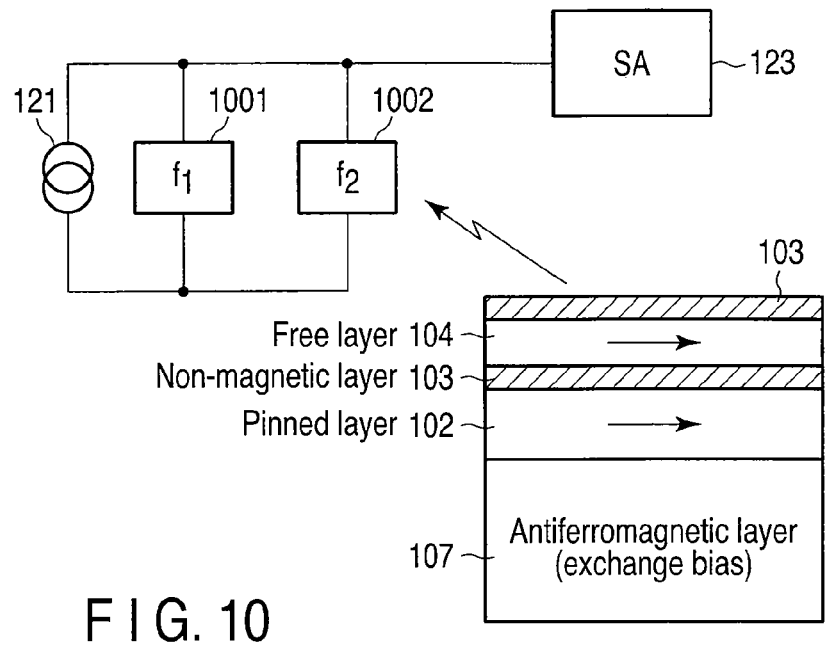
F I G. 10
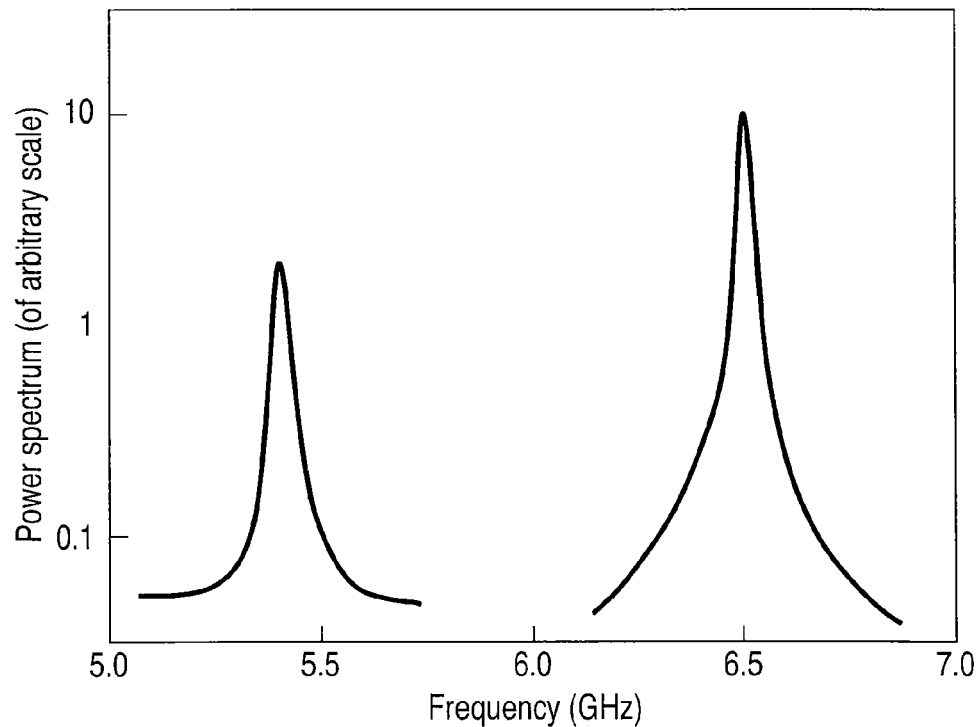
F I G. 11

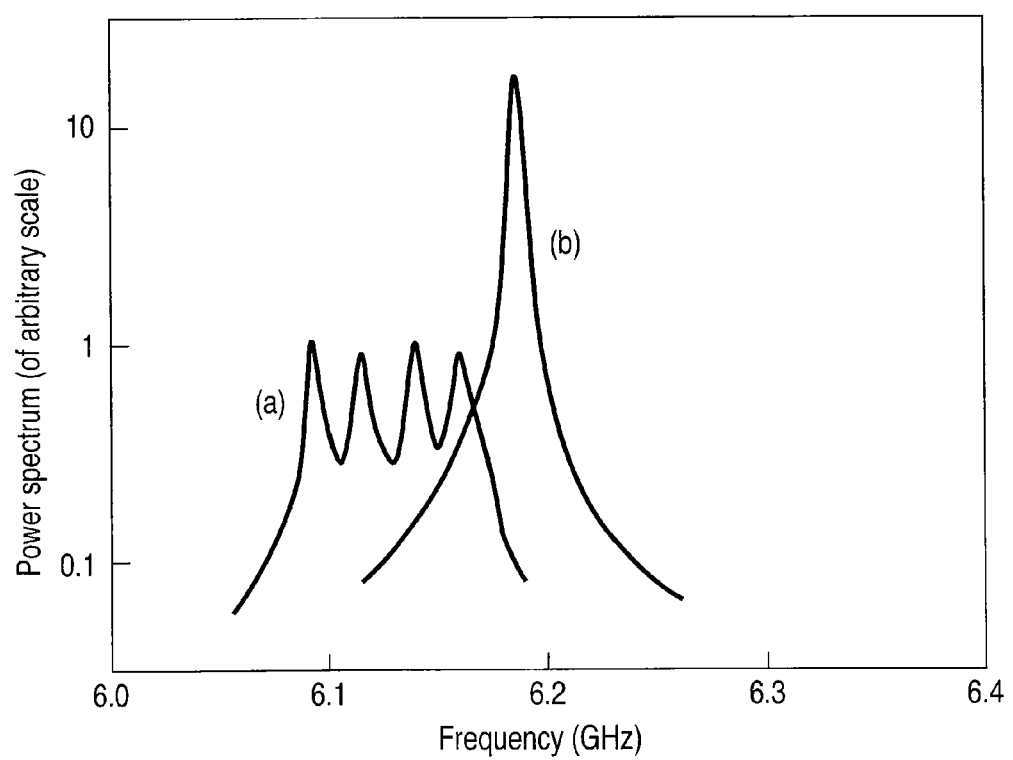
F I G. 20

MAGNETIC HEAD

CROSS-REFERENCE TO RELATED APPLICATIONS

This application is based upon and claims the benefit of priority from Japanese Patent Application No. 2010-217598, filed Sep. 28, 2010; the entire contents of which are incorporated herein by reference.

FIELD

Embodiments described herein relate generally to a magnetic head using spin torque oscillation unit.

BACKGROUND

By virtue of the development of perpendicular magnetization media and with the employment of a reading head (TMR head) that uses an TMR element (tunnel magnetoresistance effect element) as a magnetic sensor, the density of magnetic recording has increased at a 40% annual rate, and a recording density of 500 Gb/in$^2$ is attained in 2009.

(1) There is a conventional patterned medium for further significantly increasing the density of recording. In addition to this, a three-dimensional recording method utilizing a multilayered recording medium has currently been proposed. In this method, a recording medium having layers of different magnetic resonance frequencies is used, and selective writing data to the layers and selective reading data from them are executed utilizing both a spin torque oscillator and magnetic poles.

(2) Hereinafter, in accordance with further increases in recording density, media formed of finer magnetic particles than those employed at present will be used. To secure the stability of recording of these media, it is necessary to employ magnetic particles having an extremely large magnetic coercive force in order to prevent magnetization inversion of fine particles due to thermal fluctuation. However, in such media of a large coercive force, it is difficult to realize writing utilizing a recording magnetic pole. Therefore, it is considered that an assist recording method for supplying energy simultaneously with the application of the magnetic field generated by the recording magnetic pole during writing is needed. The assist recording method requires supply of energy having a great power density, which energy can realize both GHz-order high-speed performance and 10 nm locality. To this end, various methods, such as a laser assist method and a microwave assist method, have been proposed. In particular, keen attention has recently been paid to a microwave assist method utilizing a spin torque oscillator, and lots of research institutes are now developing this method. The microwave assist method utilizing the spin torque oscillator is a method in which a high-frequency magnetic field (microwave magnetic field) caused by the precession movement of the free-layer magnetization of the spin torque oscillator is used to utilize the resonance absorption phenomenon of the high-frequency magnetic field by the medium. This method is advantageous in that power can be concentrated on a desired medium bit. To enhance the assist effect, however, it is necessary to apply a strong high-frequency magnetic field to a desired medium bit. To generate a strong high-frequency magnetic field, a spin torque oscillator including a thick free layer have been developed so far.

(1) In the conventional three-dimensional recording/reproducing technique, since writing data to and reading data from the multilayered magnetic recording medium is executed sequentially for each layer, prompt writing and reading are impossible.

(2) In the conventional assist-type recording head, it is not easy to stably operate the spin torque oscillator including the thick free layer, and there is a demand for effective means for applying a strong high-frequency magnetic field.

BRIEF DESCRIPTION OF THE DRAWINGS

FIG. 4 is a preferred sectional view taken perpendicular to the tracks of the three-dimensional recording medium, and useful in explaining the method, employed in a comparative example, of reading information from the medium using a spin torque oscillatorn unit and ring magnetic poles;

FIG. 5 is a preferred view illustrating an example of a spin torque oscillation unit according to the first embodiment, which comprises a plurality of spin torque oscillation elements connected in parallel;

FIG. 10 is a preferred view illustrating the structure of a specific spin torque oscillation unit according to the first embodiment;

FIG. 11 is a graph illustrating the oscillation spectra of the specific spin torque oscillation unit;

FIG. 20 is a graph illustrating the oscillation spectra of the specific spin torque oscillation unit according to the embodiments.

DETAILED DESCRIPTION

Magnetic heads according to embodiments of the invention will be described in detail with reference to the accompanying drawings. In the embodiments, like reference numbers denote like elements that perform like operations, and duplicate explanations will be avoided.

(1) In general, according to one embodiment, there is provided a magnetic head for use in a three-dimensional magnetic recording/reproducing apparatus, the magnetic head executing a reading from or a writing to a magnetic recording medium, utilizing a magnetic resonance phenomenon of the magnetic recording medium, the magnetic recording medium including a plurality of stacked magnetic layers formed of magnetic substances having different resonance frequencies, each of the stacked magnetic layers including a recording track, the magnetic head comprising a spin torque oscillation unit and auxiliary magnetic poles. The spin torque oscillation unit is operable to simultaneously oscillate at a plurality of frequencies to cause the magnetic resonance phenomenon of the magnetic recording medium, when the reading from or the writing to the magnetic recording medium is to be executed. The auxiliary magnetic poles assist the spin torque oscillation unit, when the reading from or the writing to the magnetic recording medium is to be executed.

This embodiment can provide a magnetic head capable of reading data from a multi-layered magnetic recording medium at higher speed. Also, this embodiment can provide a magnetic head capable of writing data to a multi-layered magnetic recording medium at higher speed.

(2) Further, according to another embodiment, there is provided a recording magnetic head using a high-frequency assist method and comprising a microwave magnetic field applying unit and a recording magnetic pole. The microwave magnetic field applying unit executes a writing to a recording track on a recording medium, and is formed of a plurality of spin torque oscillation elements having phases thereof synchronized. The recording magnetic pole assists the writing by the microwave magnetic field applying unit.

This embodiment can provide an assist type recording head capable of applying a much stronger high-frequency magnetic field.

Figure 1:
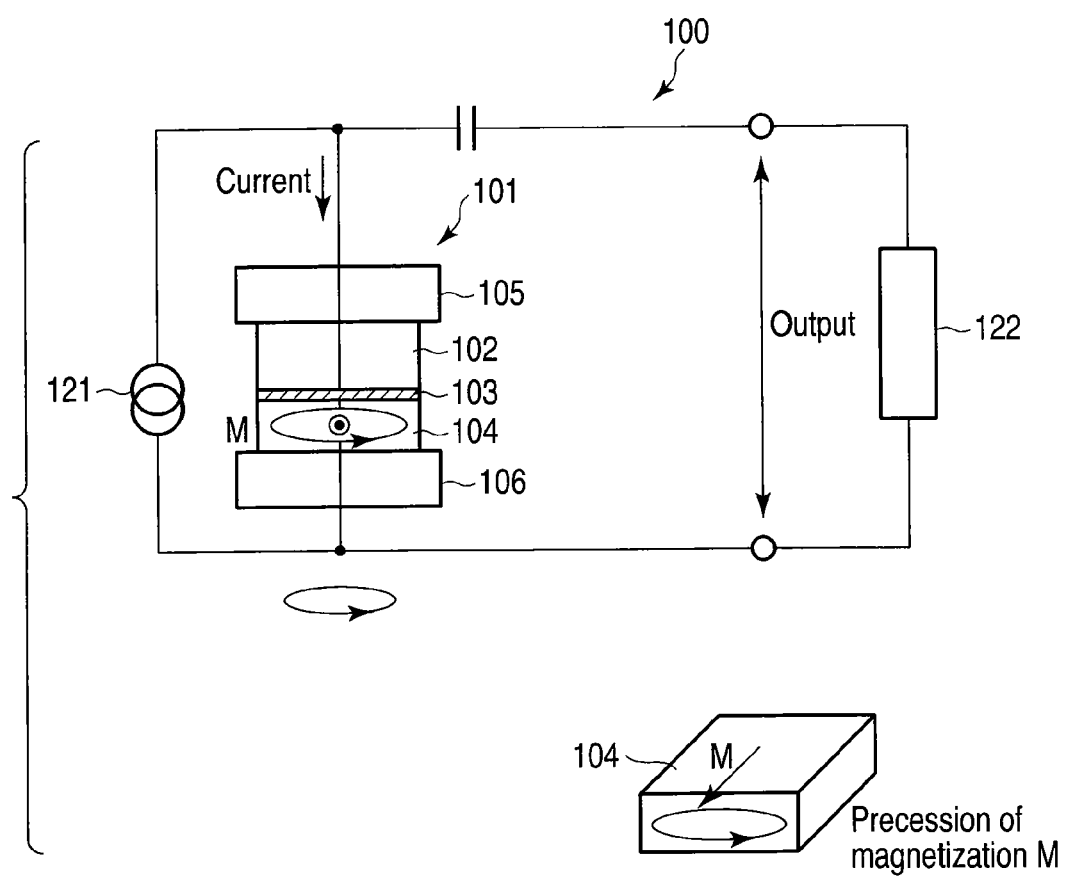
FIG. 1 is a preferred block diagram illustrating the schematic basic structure of a three-dimensional magnetic recording/reproducing apparatus using a spin torque oscillation unit.

Referring first to FIG. 1, a description will be given of the basic structure of a three-dimensional recording/reproducing apparatus using a spin torque oscillation unit.

As shown in FIG. 1, a three-dimensional recording/reproducing apparatus 100 comprises a spin torque oscillation unit 101, a DC current supply 121, and a load 122. The embodiments described below use auxiliary magnetic poles (recording magnetic poles) (not shown) in addition to the spin torque oscillation unit. The auxiliary magnetic poles will be described later.

The spin torque oscillation unit 101 has a three-layer structure that mainly comprises a pinned layer (magnetization pinned layer) 102, a non-magnetic layer 103, and a free layer 104 formed in this order, as is schematically shown in FIG. 1. The spin torque oscillation unit 101 has a size of several tens of nanometers. An upper electrode 105 is stacked on the upper surface of the fixed layer 102, and a lower electrode 106 is stacked on the lower surface of the free layer 104. The spin torque oscillation unit 101 is held between the electrodes 105 and 106. The specific structure of the spin torque oscillation unit 101 will be described later.

The spin torque oscillation unit 101 can be used as a read oscillation unit for reading data from a magnetic recording medium (not shown, but located below the lower electrode 106), or can be used as an assist (write) oscillation unit for writing data to the magnetic recording medium.

The spin torque oscillation unit 101 may be oriented as shown in FIG. 1. Alternatively, it may be used with its orientation clockwise or counterclockwise rotated through 90 degrees relative to the position of FIG. 1. Yet alternatively, it may be used with its orientation rotated through 180 degrees relative to the position of FIG. 1. The same can be said of various spin torque oscillation elements described below.

To form the fixed layer 102, for example, a Co film, a Co/non-magnetic-substance laminated film, or a CoCr-based alloy film made of, for example, CoCrTa, CoCrTaPt or CoTaNb may be used as a magnetization film. Alternatively, a Co multilayer made of, for example, Co/Pd, Co/Pt and Co—Cr—Ta/Pd, or a CoCrPt-based alloy, or a FePt-based alloy may be used. Yet alternatively, a SmCo-based alloy containing a rare earth, or a TbFeCo alloy may be used. The fixed layer 102 has its magnetization direction fixed.

As the material of the non-magnetic layer 103, for example, a tunnel insulating film, for example, Al—O (aluminum oxide) film, or a non-magnetic metal such as Cu.

The free layer 104 is made of a magnetic material that can be magnetized to a high degree, such as Fe or an FeCo alloy, because significant saturation magnetization M is needed to form a strong high-frequency magnetic field. The free layer 104 has its magnetization direction set freely rotatable.

The DC supply 121 supplies a direct current to the spin torque oscillation unit 101.

The load 122 is used to read the value of a high-frequency voltage of several to several tens GHz that occurs due to the tunnel magnetoresistive effect (TMR) between the precessional magnetization of the free layer 104 and the fixed magnetization of the fixed layer 102.

Brief descriptions will now be given of the operation of the spin torque oscillation unit 101 during reading data from a recording medium, and that of the spin torque oscillation unit 101 during writing data to the recording medium.

Firstly, the DC supply 121 supplies a DC current to the spin torque oscillation unit 101. If the DC current is not less than a threshold value, the magnetization M of the free layer 104 of the spin torque oscillation unit 101 starts precessional motion. The lower right portion of FIG. 1 shows the precessional motion of the magnetization M of the free layer 104. Thus, a precessional motion occurs with respect to the direction of the magnetization assumed when the DC current is zero.

A high-frequency voltage of several to several tens GHz occurs due to the tunnel magnetoresistive effect (TMR) between the precessional magnetization of the free layer 104 and the fixed magnetization of the fixed layer 102, and is output to the load 122. In addition, in the proximity of the spin torque oscillation unit 101, a high-frequency magnetic field (high-frequency rotational magnetic field) of several to several tens GHz also occurs because of the recessional movement of the free layer magnetization. In the three-dimensional magnetic recording/reproducing apparatus 100, writing and reading of records are performed utilizing both the voltage output (power output) and the high-frequency magnetic field. The high-frequency magnetic field is also called a microwave magnetic field or a near field.

Data writing and data reading differ from each other in that in the former, a greater magnetic field is produced by recording a magnetic pole and a greater high-frequency magnetic is produced by the oscillation unit, than in the latter.

(1) First Embodiment

A first embodiment is directed to three-dimensional magnetic recording/reproducing utilizing the magnetic resonance phenomenon of a medium, and aims to realize simultaneous reading of data from a plurality of recording layers incorporated in a medium, using a spin torque oscillation unit as a magnetic sensor. The first embodiment is also directed to three-dimensional magnetic recording/reproducing utilizing the magnetic resonance phenomenon of a medium, and aims to realize simultaneous writing of data to a plurality of recording layers incorporated in the medium, using the spin torque oscillation unit as a microwave assist.

A description will firstly be given of the basic structure and operation of a magnetic head (a reading magnetic head/a writing magnetic head) using the spin torque oscillation unit and auxiliary magnetic poles.

Figure 2:
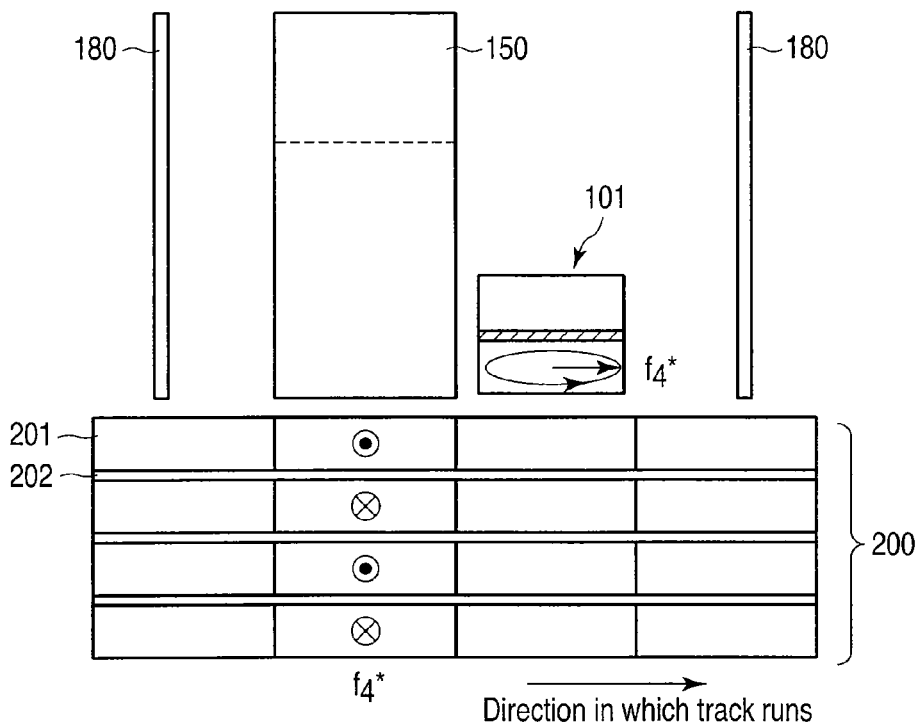
FIG. 2 is a preferred sectional view taken parallel to the tracks of a three-dimensional recording medium, and useful in explaining a method, employed in a first embodiment, of reading information from the medium using the spin torque oscillation unit and ring magnetic poles.
Figure 3:
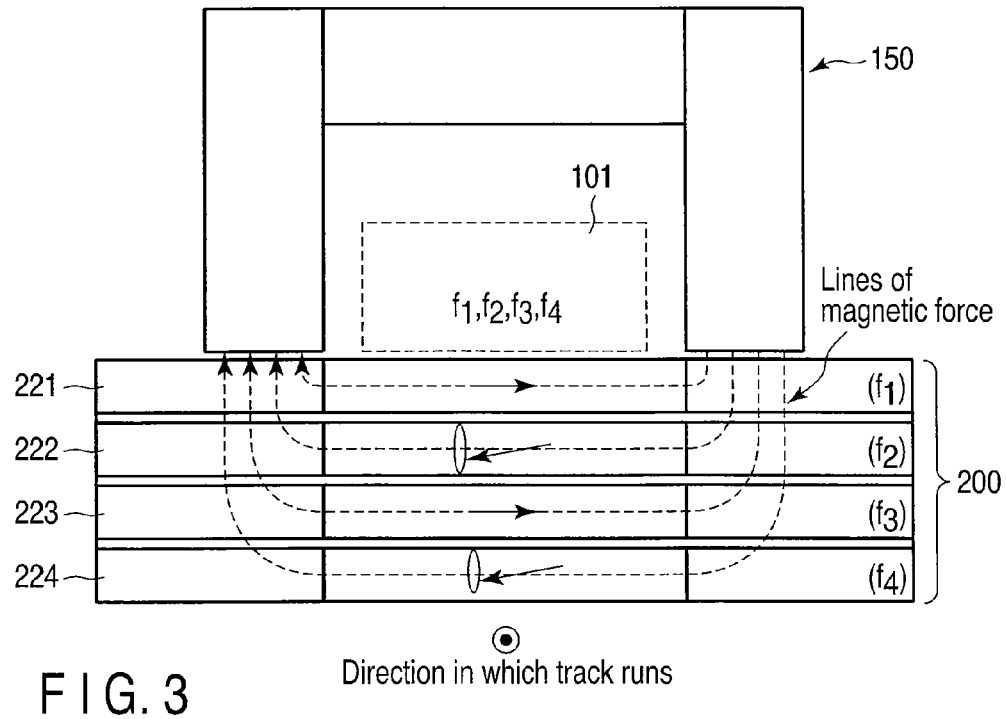
FIG. 3 is a preferred sectional view taken perpendicular to the tracks of the three-dimensional recording medium, and useful in explaining the method, employed in the first embodiment, of reading information from the medium using the spin torque oscillation unit and the ring magnetic poles.

FIG. 2 is a sectional view parallel to the tracks of a disk, and illustrating the magnetic head using the spin torque oscillation unit and auxiliary magnetic poles, and FIG. 3 is a sectional view similar to FIG. 2 and vertical to the tracks of the disk.

FIG. 4 is a sectional view vertical to the tracks and illustrating a magnetic head as a comparative. (Since the sectional view of the comparative parallel to the tracks is similar to FIG. 2, it is omitted.)

The magnetic head of the embodiment comprises auxiliary magnetic poles 150, and a spin torque oscillation unit 101 provided near the magnetic poles. The magnetic head may be contained in a magnetic shield 180. The spin torque oscillation unit 101 can simultaneously emit a plurality of frequencies, which will be described later in detail.

In this embodiment, ring-shaped magnetic poles are used as the auxiliary magnetic poles 150.

In FIGS. 2 and 3, reference number 200 denotes a recording medium. In this embodiment, an in-plane magnetization medium with four layers (221 to 224) having different resonance frequencies is used as the recording medium 200. In this in-plane magnetization medium, the magnetization of each bit is perpendicular to the tracks of a disk, unlike the existing longitudinal recording. It is a matter of course that this embodiment can also be applied to a recording medium with two or three layers or five or more layers.

The three-dimensionally recordable recording medium 200 is formed by, for example, alternately stacking magnetic layers 201 and non-magnetic layers 202. The magnetic layers 201 isolated by the non-magnetic layers 202 are formed of magnetic materials having different resonance frequencies (in the embodiment, $f_1$, $f_2$, $f_3$, $f_4$). The resonance frequencies of the magnetic layers 201 are arranged in an increasing order, beginning with the magnetic layer closest to the magnetic head, namely, $f_1 < f_2 < f_3 < f_4$ in this embodiment.

FIGS. 2 and 3 show a case where the magnetic head incorporates a single spin torque oscillation unit 101 (in this case, the spin torque oscillation unit 101 is used as a reading oscillation unit for a read head, or an assist oscillation unit for a recording head). Alternatively, the magnetic head may incorporate two oscillation units, i.e., a spin torque oscillation unit used as the reading oscillation unit, and a spin torque oscillation unit used as the assist oscillation unit (in this case, for example, the two spin torque oscillation units (101) are located at the opposite sides of the auxiliary magnetic poles 150 in FIGS. 2 and 3).

A description will be given of the case where the spin torque oscillation unit 101 is used as the reading oscillation unit.

Firstly, the case of reading one bit from one of the recording layers will be described.

When the auxiliary magnetic poles 150 are used in addition to the spin torque oscillation unit 101, the auxiliary magnetic poles 150 are used to select a desired bit in the recording layers, and it is necessary to set the magnetic field, applied by the auxiliary magnetic poles 150, to a low level with which the magnetization of each bit is not inverted. Since the magnetic resonance phenomenon of the selected bit is detected as a reduction in the output voltage of the spin torque oscillation unit 101, bit reading is realized by this detection.

A consideration will now be given to the case of reading a particular bit from one (e.g., the fourth layer with the resonance frequency of $f_4$) of the four layers positioned just below the auxiliary magnetic poles 150. The auxiliary magnetic poles 150 apply, to the particular bit of the fourth layer, a magnetic field stronger than that applied to the other bits of the fourth layer, with the result that the resonance frequency of the bit changes from $f_4$ to $f_4^*$. Accordingly, if the frequency of the spin torque oscillation element is set to $f_4^*$, resonance absorption occurs selectively in the particular bit of the fourth layer positioned just below the auxiliary magnetic poles 150.

The high-frequency magnetic field produced by the spin torque oscillation unit 101 causes magnetic resonance absorption irrespective of the direction of magnetization of the recording medium 200. However, if the auxiliary magnetic poles 150 are used, magnetic resonance absorption can be made to occur in one direction. Namely, when the magnetic field produced by the assist magnet exerts on the magnetization of the recording medium 200, the resonance frequency of magnetization parallel to the magnetic field changes from the resonance frequency $f$ of the recording layer to $f^* = f + \Delta f$, while the resonance frequency antiparallel magnetization changes from the resonance frequency $f$ to $f^* = f - \Delta f$. Accordingly, if the frequency of the spin torque oscillation unit 101 is set to $f + \Delta f$ (in the above-mentioned fourth layer, $f_4 + \Delta f_4$), magnetic resonance can be induced for parallel magnetization, while if the frequency of the spin torque oscillation unit 101 is set to $f - \Delta f$ (in the above-mentioned fourth layer, $f_4 - \Delta f_4$), magnetic resonance can be induced for antiparallel magnetization. Thus, a desired bit can be read selectively.

When the auxiliary magnetic poles are used, it may be difficult to position the spin torque oscillation unit 101 just above a to-be-read bit. However, it is known that a magnetic substance in the resonance state is higher in high-frequency magnetic permeability by ten times or more than in the non-resonance state. As a result, even when the spin torque oscillation unit 101 is not positioned just above the to-be-read bit, the magnetic flux of the high-frequency magnetic field concentrates on the to-be-read bit, whereby a sufficiently strong magnetic field is applied to the bit. Although the auxiliary magnetic poles 150 shown in FIGS. 2 and 3 are positioned close to the spin torque oscillation unit 101, the arrangement is not limited to this. It is sufficient if the auxiliary magnetic poles 150 and the spin torque oscillation unit 101 are positioned so that the electromagnetic wave radiated by the spin torque oscillation unit 101 will effectively reach a to-be-read bit.

A description will then be given of the difference between the comparative shown in FIG. 4 and the reading operation of the first embodiment shown in FIG. 3.

In the comparative shown in FIG. 4, a spin torque oscillator with a single frequency is used along with the auxiliary magnetic poles 150 to sequentially read data from a plurality of layers.

Accordingly, when, for example, an in-plane magnetization medium having four layers of different resonance frequencies is used, a spin torque oscillator 9001 as the comparative sequentially performs read operations for the respective four layers and for parallel magnetization and anti-parallel magnetization, namely, performs 8 read operations in total.

In contrast, in the first embodiment shown in FIG. 3, a spin torque oscillation unit 101 capable of emitting different frequencies is used along with the auxiliary magnetic poles 150, and data can be simultaneously read (can be read at a time) from a multi-layer medium having different resonance frequencies. For instance, when an in-plane magnetization medium having four layers of different resonance frequencies is used, if the spin torque oscillation unit 101 can simultaneously emit four frequencies, it can simultaneously read data from the four layers. As a result, it is sufficient if the spin torque oscillation unit 101 performs one read operation for parallel magnetization and for anti-parallel magnetization, namely, performs two read operations in total. In this case, a first phase in which simultaneous reading of the first to fourth layers is performed for parallel magnetization, and a second phase in which simultaneous reading of the first to fourth layers is performed for anti-parallel magnetization, may be executed alternately, for example. Alternatively, other methods may be employed.

Further, if the spin torque oscillation unit 101 can simultaneously emit two frequencies, it may execute simultaneous reading of two layers twice for parallel magnetization, and execute simultaneous reading of two layers twice for anti-parallel magnetization. In this case, four read operations are performed in total.

Further, the spin torque oscillation unit 101 of the first embodiment shown in FIG. 3 can perform selective reading concerning an arbitrary number of arbitrary recording layers (and concerning parallel magnetization or anti-parallel magnetization for each recording layer), using simultaneously emissible frequencies. FIG. 3 shows an example where the second and fourth layers are selected for reading. It is a matter of course that the spin torque oscillation unit 101 can perform selective reading concerning one arbitrary recording layer (and concerning parallel magnetization or anti-parallel magnetization for the recording layer).

A description will later be given of a specific structure example of the spin torque oscillation unit 101 serving as the reading oscillation unit.

A description will now be given of the case where the spin torque oscillation unit 101 is used as the assist oscillation unit.

Firstly, the case of writing a bit to one of the plurality of recording layers will be described.

An assist type recording head has the same structure as the read head using the auxiliary magnetic poles 150. Recording and reading operations differ from each other in that in the former, a stronger to-be-applied magnetic field than in the latter is produced by the recording magnetic poles (auxiliary magnetic poles) 150, and a stronger to-be-applied high-frequency magnetic field than in the latter is produced by the oscillation unit.

An example where the magnetization of a bit contained in the $n^{th}$ layer and positioned just below the recording magnetic poles 150 is inversed. The assist behavior of a high-frequency magnetic field (also called a high-frequency assist method) occurs based on two principles. The first principle is the resonance inversion of magnetization due to the high-frequency magnetic field, and the second principle is the resonance absorption heating of a magnetic substance due to the high-frequency magnetic field. The first principle mainly exerts on a medium formed of a magnetic substance having a low attenuation constant $\alpha$, and the second principle mainly exerts on a medium formed of a magnetic substance having a high attenuation constant $\alpha$.

The first principle will be explained briefly. A recording head magnetic field $H_n$ weaker than the anisotropic magnetic field $H_k$ of the magnetic substance of the $n^{th}$ layer is applied to a desired bit in the direction opposite to the magnetization M of the bit. Since $H_n$ is weaker than $H_k$, magnetization inversion does not occur in this state. However, if a high-frequency magnetic field h of the resonance frequency given by the following equation (1) is simultaneously applied to the desired bit, using a fine magnetic oscillation element, the magnetization M starts to perform precession.

$$f_n = (\gamma/2\pi)(H_K - H_n) \quad (1)$$

If the high-frequency magnetic field h is sufficiently strong and the relationship given by the following inequality (2) is satisfied, the amplitude of the precession increases with time, and the magnetization M is inversed at last:

$$(\gamma/2\pi)h > \alpha f_n \quad (2)$$

where $\gamma$ represents the gyromagnetic ratio.

The magnetization of a bit that is not positioned just below the recording head, and the magnetization of a bit contained in another recording layer, do not satisfy the equation (1), and therefore do not resonate with the high-frequency magnetic field to cause no magnetization inversion.

The second principle will be explained briefly. A high-frequency power P absorbed by a recording medium depends upon the imaginary part $\chi''$ of the magnetized ratio of the recording medium and given by the following equation (3):

$$P = (1/2)\chi'' h^2 \omega \quad (3)$$

where h represents the high-frequency magnetic field, and $\chi''(\omega)$ strongly depends upon the frequency. For instance, $\chi''(\omega)$ is as small as about 1 at a frequency significantly different from the resonance frequency of the recording medium, while $\chi''(\omega)$ increases to about 10 to 100 near the resonance frequency. Since the heating efficiency of the recording medium depends upon its absorption power, the recording medium is strongly heated by a high-frequency magnetic field of a frequency close to the resonance frequency. Namely, the bit contained in the $n^{th}$ layer and positioned just below the recording magnetic poles is heated, and the other bits are little heated. When the temperature of the recording medium is increased, the anisotropic constant $K_{u1}$ of the recording medium is reduced as in the case of laser assisting, and writing is executed by selective magnetization inversion by the magnetic field of the recording head.

The first and second principles individually exist only in typical cases. In many actual cases, the first and second principles coexist, in which magnetization inversion occurs. In these cases, writing is executed on the recording medium by inverting the magnetization of a desired bit of a three-dimensional recording medium using the high-frequency assist method.

The difference in write operation between the comparative of FIG. 4 and the embodiment of FIG. 3 (i.e., the first embodiment) is similar to the aforementioned difference in read operation.

For instance, when an in-plane magnetization medium having four layers of different resonance frequencies is used, eight write operations are needed in total in the spin torque oscillator 9001 as the comparative. In contrast, two write operations (in each write operation, simultaneous writing of the four layers is executed) are needed in total in the spin torque oscillation unit 101 of the first embodiment, if the spin torque oscillation unit 101 can simultaneously emit four frequencies. Further, if the spin torque oscillation unit 101 can simultaneously emit two frequencies, four write operations are needed in total (in each write operation, simultaneous writing of the two layers is executed).

In addition, the spin torque oscillation unit 101 of the first embodiment shown in FIG. 3 can perform selective writing concerning an arbitrary number of arbitrary recording layers (and concerning parallel magnetization or anti-parallel magnetization for each recording layer), using simultaneously emissible frequencies. FIG. 3 shows an example where the second and fourth layers are selected for writing. It is a matter of course that the spin torque oscillation unit 101 can perform selective writing concerning one arbitrary recording layer (and concerning parallel magnetization or anti-parallel magnetization for the recording layer).

A description will later be given of a specific structure example of the spin torque oscillation unit 101 for emitting different frequencies (i.e., used as the assist oscillation unit).

A description will now be given of the case where the spin torque oscillation unit 101 is used as the reading oscillation unit.

Since reading of data from the recording medium is executed by measuring changes in the output voltage of the reading oscillation unit as shown in FIG. 1, it is preferable that a TMR type oscillation elements of a high voltage output be used as the oscillation elements of the spin torque oscillation unit 101 that serves as the reading oscillation unit. A spin torque oscillation unit comprised of TMR type oscillation elements may be referred to as TMR type oscillation unit.

However, since the TMR type oscillation element have a high resistance, it is desirable, in consideration of impedance matching with a measuring circuit, that the spin torque oscillation unit 101 shown in FIG. 3 comprises a plurality of TMR type oscillation elements having different oscillation frequencies connected in parallel.

FIG. 5 shows an example of a spin torque oscillation unit 101 comprising a plurality of spin torque oscillation elements (e.g., four elements) corresponding to a plurality of (e.g., four elements) recording layers. In FIG. 5, reference number 121 denotes a DC supply, and reference numbers 1001 to 1004 denote a first recording-layer reading oscillation element (with a resonance frequency of $f_1$) to a fourth recording-layer reading oscillation element (with a resonance frequency of $f_4$), respectively. The right portion of FIG. 5 shows the structure of each oscillation element. In this portion, reference number 102 denotes a pinned layer, reference number 103 denotes a non-magnetic layer, reference number 104 denotes a free layer, and reference number 107 denotes an antiferromagnetic substance (exchange bias).

Figure 6:
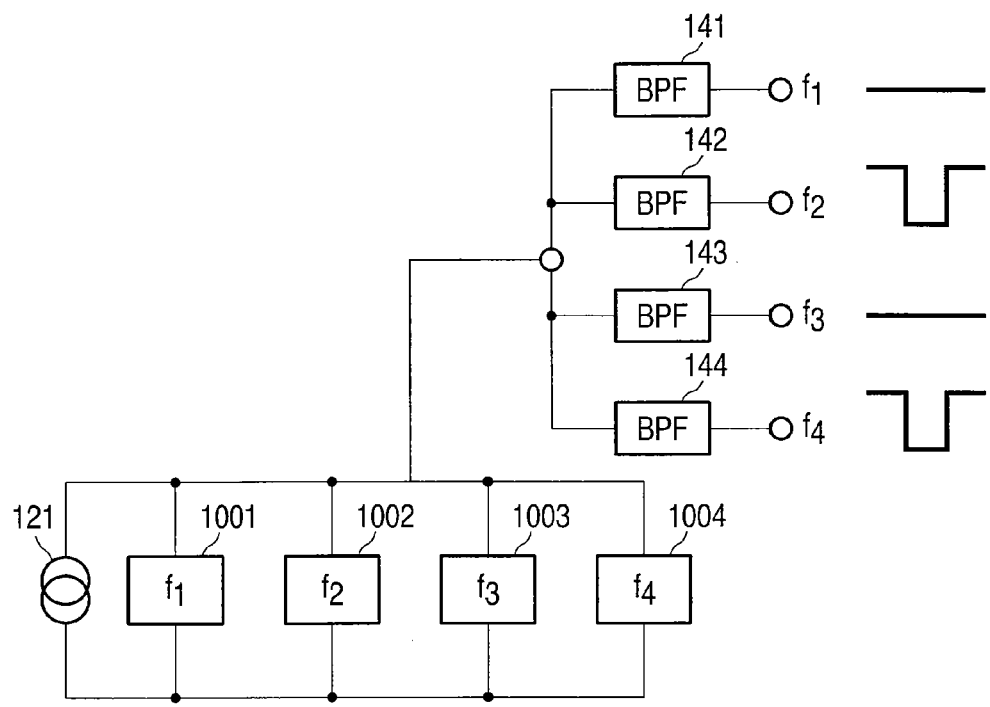
FIG. 6 is a preferred view illustrating a structure example of a circuit for simultaneously reading data from multi layers, according to the first embodiment.

FIG. 6 shows an example of a circuit structure for reading the value of a high-frequency voltage that may occur at each recording layer when data is simultaneously read from a plurality of recording layers. In this example, band-pass filters 141 to 144 for passing high-frequency voltage signals to the recording layers.

For instance, a high-frequency voltage signal generated for the first recording layer passes through the band-pass filter 141 to a load (not shown) for the first recording layer where the value of the signal is read. The same can be said of the other recording layers.

FIG. 6 shows a case where the second and fourth layers are read.

A structure example of the spin torque oscillation unit 101 used as the assist oscillation unit will be described.

Since the writing of data to the recording medium is performed utilizing the assist effect of a high-frequency magnetic field that occurs near the spin torque oscillation unit 101, it is preferable that the spin torque oscillation unit 101 used as an assist oscillation unit should be formed of CPP-GMR type oscillation elements that realize a large precession of magnetization by using a large current. A spin torque oscillation unit comprised of CPP-GMR type oscillation elements may be referred to as CPP-GMR type oscillation unit.

However, since the CPP-GMR type oscillation element has a low resistance, it is preferable, in consideration of impedance matching with a measurement circuit, that the spin torque oscillation unit 101 be formed of a plurality of CPP-GMR type oscillation elements of different frequencies connected in series.

Figure 7:
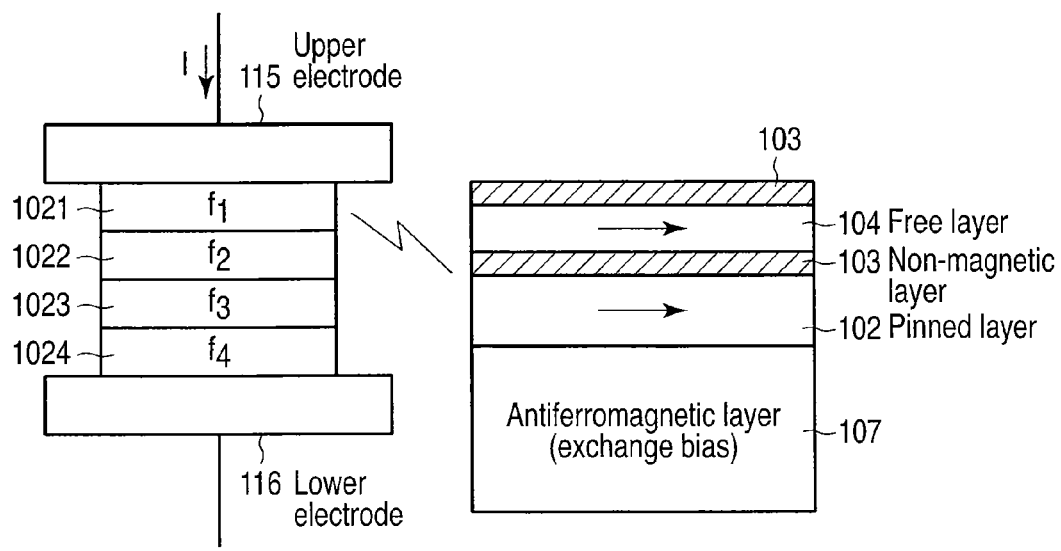
FIG. 7 is a preferred view illustrating another example of the spin torque oscillation unit according to the first embodiment, which comprises a plurality of spin torque oscillation elements connected in series.

FIG. 7 shows an example in which the spin torque oscillation unit 101 is formed of elements corresponding to a plurality of recording layers (e.g., four recording layers) and connected in series. In FIG. 7, reference numbers 1021 to 1024 denote a first assist oscillation element (with a resonance frequency of $f_1$) for the first recording layer, to a fourth assist oscillation element (with a resonance frequency of $f_4$) for the fourth recording layer, respectively. Further, reference number 115 denotes an upper electrode, and reference number 116 denotes a lower electrode. The right part of FIG. 7 shows a structure example of each element, in which reference number 102 denotes a pinned layer, reference number 103 denotes a non-magnetic layer, reference number 104 denotes a free layer, and reference number 107 denotes an antiferromagnetic substance (exchange bias).

Figure 8:
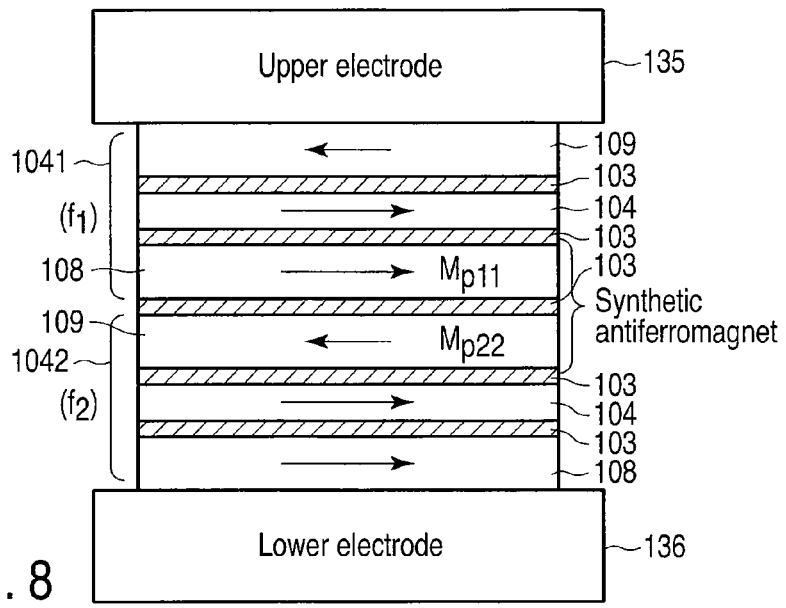
FIG. 8 is a preferred view illustrating yet another example of the spin torque oscillation unit according to the first embodiment, which comprises a plurality of spin torque oscillation elements connected in series.
Figure 9:
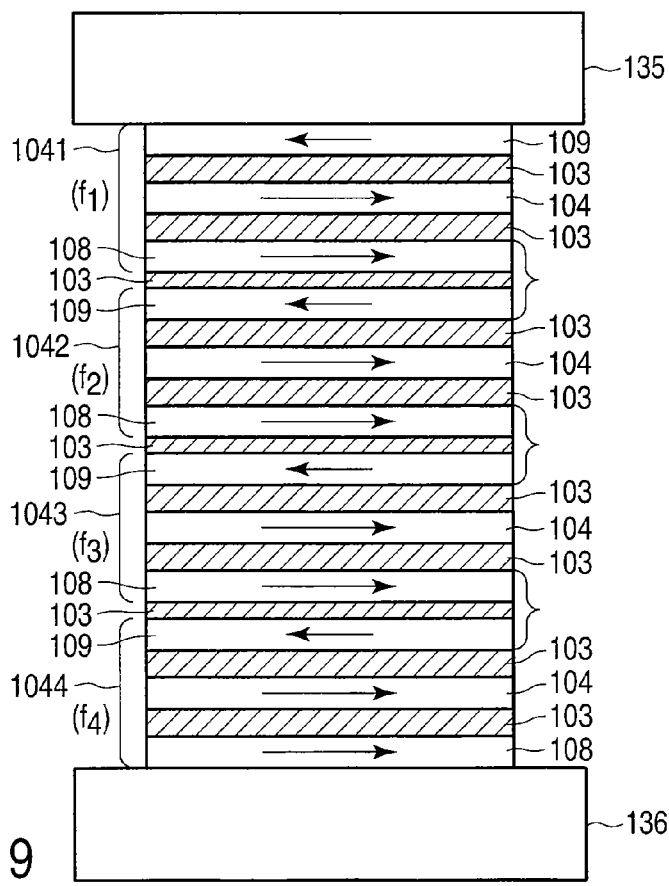
FIG. 9 is a preferred view illustrating yet another example of the spin torque oscillation unit according to the first embodiment, which comprises a plurality of spin torque oscillation elements connected in series.

FIG. 8 shows an example of a spin torque oscillation unit 101 formed of elements corresponding to two recording layers and connected in series, and FIG. 9 shows an example of a spin torque oscillation unit 101 formed of elements corresponding to four recording layers and connected in series. In these figures, reference numbers 1041 to 1044 denote a first assist oscillation element (with a resonance frequency of $f_1$) for the first recording layer, to a fourth assist oscillation element (with a resonance frequency of $f_4$) for the fourth recording layer, respectively. Further, reference number 135 denotes an upper electrode, reference number 136 denotes a lower electrode, reference number 102 denotes a pinned layer, reference number 103 denotes a non-magnetic layer, reference number 104 denotes a free layer, and reference numbers 108 and 109 denote synthetic antiferromagnetic layers (Mp11 and Mp22). These layers are example layers incorporated in each of the spin torque oscillation unit 101.

Referring then to FIGS. 10 and 11, specific examples actually formed and subjected to experiments will be described.

A spin torque oscillation unit comprising two oscillation elements (corresponding to the elements shown in FIG. 5) was prepared as shown in FIG. 10 by processing, using an electron beam and photolithography, a magnetic laminated film formed on a glass substrate by sputtering. The free layer of the element 1001 is a CoFeB layer of 2 nm, and the free layer of the element 1002 is a CoFe layer. The synthetic antiferromagnetic layers of the elements 1001 and 1002 are each formed of a CoFeB (4 nm)/Ru (0.95 nm)/CoFe (4 nm) multilayer. The non-magnetic layers of the elements 1001 and 1002 are each formed of a Cu layer of 4 nm. The sizes of the elements 1001 and 1002 are 40 nm×80 nm both.

Under an external magnetic field of 500 Oe, the oscillation spectra of the elements 1001 and 1002, emitted when a CD current is flown through the elements in the circuit of FIG. 10, were observed using a spectrum analyzer (SA) 123. FIG. 11 shows the result of the observation. As shown, strong oscillation spectra of 5.3 GHz and 6.5 GHz were observed.

As described above, since in the first embodiment, a spin torque oscillation unit comprising a plurality of oscillation elements of different frequencies (instead of a single spin torque oscillator) is used along with the auxiliary magnetic poles, data can simultaneously be read from a multi-layer three-dimensional medium to thereby enhance the reading efficiency. Similarly, the use of a spin torque oscillation unit comprising a plurality of oscillation elements of different frequencies (instead of a single spin torque oscillator) is used along with the auxiliary magnetic poles (recording magnetic poles) enables simultaneous writing of data to the multi-layer three-dimensional medium to thereby enhance the writing efficiency.

(2) Second Embodiment

A second embodiment is directed to an improvement of a microwave magnetic field applying mechanism used for assisting magnetic recording, along with a recording magnetic pole. When a microwave assist method using a spin torque oscillation unit (a method for causing magnetic resonance absorption to occur in a medium bit using a microwave magnetic field, thereby facilitating recording by the recording magnetic pole) is employed to write data to a medium, the improved mechanism can apply a stronger microwave magnetic field to enhance the assist effect.

Figure 12:
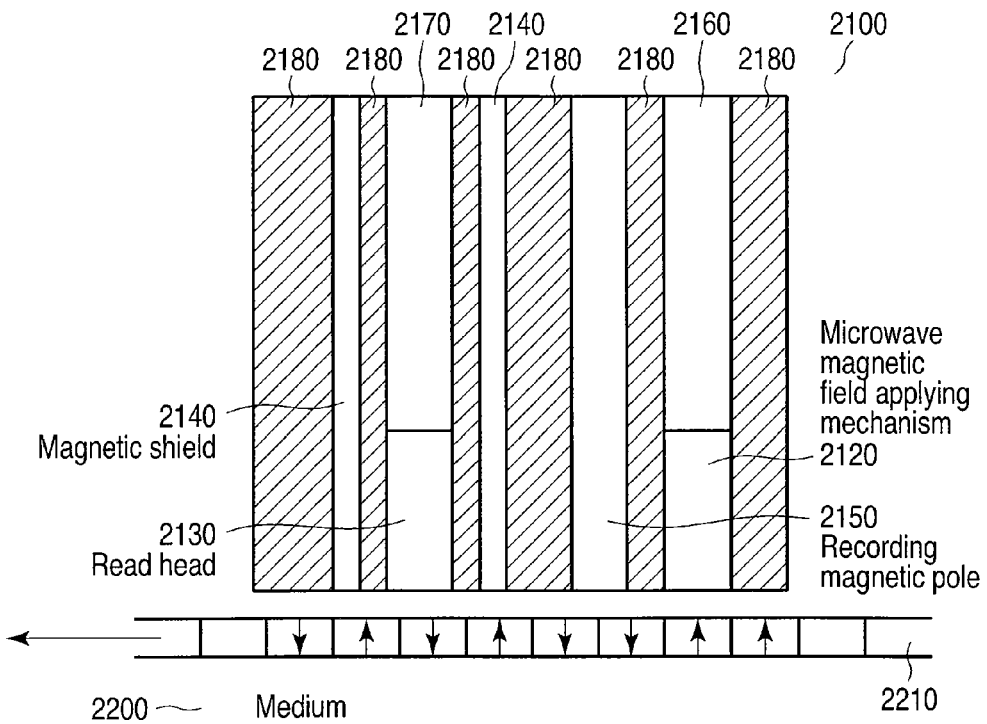
FIG. 12 is a preferred view illustrating a first basic structure example of a microwave assist type magnetic head according to a second embodiment.
Figure 13:
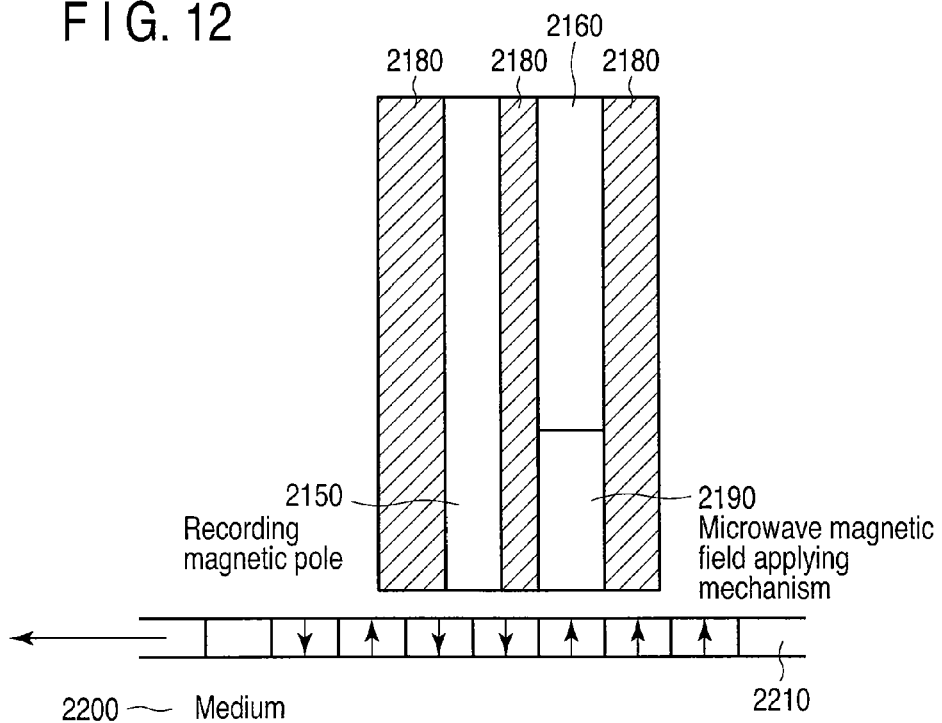
FIG. 13 is a preferred view illustrating a second basic structure example of a microwave assist type magnetic head according to the second embodiment.

FIG. 12 shows a basic structure example of a microwave assist type magnetic head that comprises an assist spin torque oscillation unit (a microwave magnetic field applying mechanism), and a read head separate from the oscillation unit. FIG. 13 shows a basic structure example of a microwave assist type magnetic head in which the microwave magnetic field applying mechanism (microwave magnetic field applying unit) also serves as the read head. The second embodiment is applicable to both microwave assist type magnetic heads (the microwave magnetic field applying mechanisms of both microwave assist type magnetic heads).

In FIG. 12, reference number 2100 denotes a microwave assist type magnetic head, reference number 2120 denotes an assist spin torque oscillation unit (microwave magnetic field applying mechanism), reference number 2130 denotes a read head, reference number 2140 denotes a magnetic shield, reference number 2150 denotes recording pole, reference numbers 2160 and 2170 denote electrodes, reference number 2180 denotes a non-magnetic layer, reference number 2200 denotes a recording medium, and reference number 2210 denotes a recording layer. The assist spin torque oscillation unit 2120 is positioned near the recording magnetic pole 2150, and the read head is contained in the magnetic shield 2140.

In FIG. 13, reference number 2300 denotes a microwave assist type magnetic head, and reference number 2190 denotes a reading/assist spin torque oscillation unit. The reading/assist spin torque oscillation unit 2190 is positioned near the recording magnetic pole 2150. The structure of FIG. 13 differs from that of FIG. 12 in that the former does not have an independent read head. The recording magnetic pole (auxiliary magnetic pole) 2150 and the reading/assist spin torque oscillation unit 2190 may be contained in a magnetic shield (not shown).

A description will be given only of the FIG. 12 type. However, almost the same can be said of the FIG. 13 type.

Figure 14:
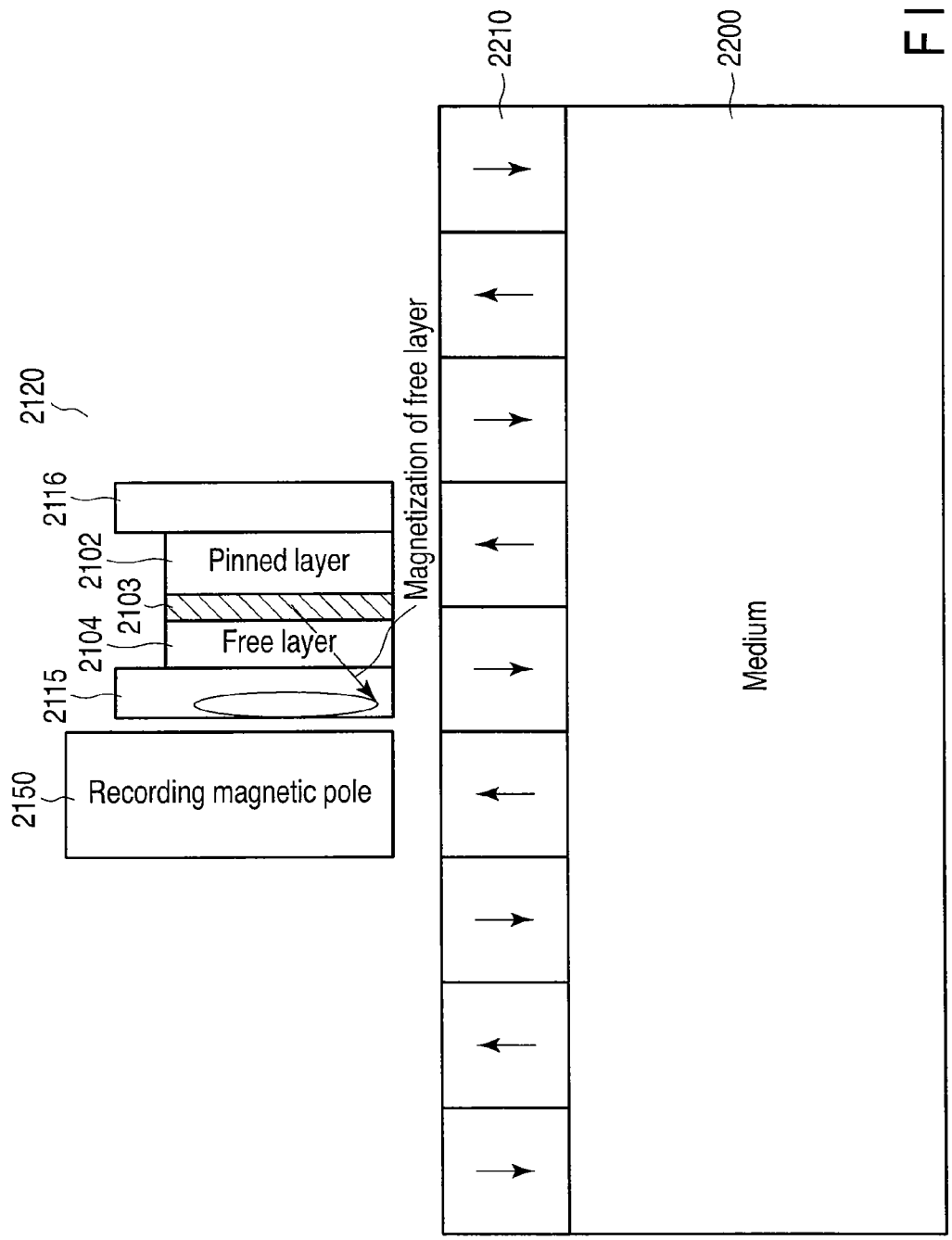
FIG. 14 is a schematic view illustrating the basic structure of an assist spin torque oscillation unit.

Referring to FIG. 14, the basic structure and operation of the assist spin torque oscillation unit will be described. FIG. 14 shows the basic structure of the assist spin torque oscillation unit (microwave magnetic field applying mechanism) 2120. In FIG. 14, reference number 2102 denotes a pinned layer, reference number 2103 denotes a non-magnetic layer, reference number 2104 denotes a free layer, and reference numbers 2115 and 2116 denote electrodes. A specific structure example of the assist spin torque oscillation unit will be described later.

Figure 15:
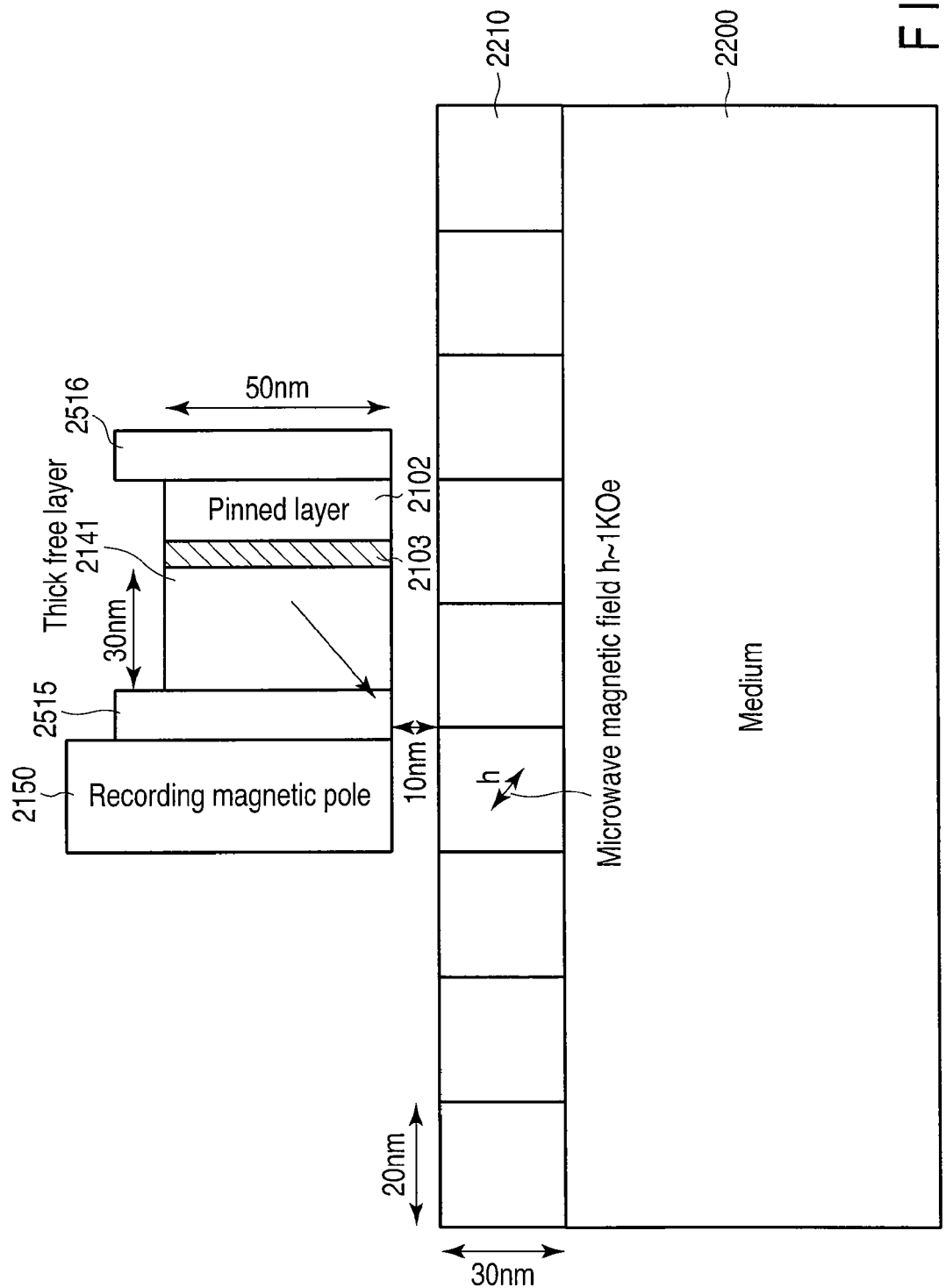
FIG. 15 is a view illustrating a structure example of a comparative spin torque oscillator with a thick free layer.

As shown, assist spin torque oscillation unit 2120 is positioned adjacent to the recording magnetic pole 2150. In accordance with the precession of the magnetization of the free layer 2104, a high-frequency magnetic field (microwave magnetic field) occurs near the spin torque oscillation unit 2120, thereby causing magnetic resonance absorption in a bit of the recording layer 2210 to assist magnetization inversion (writing) by the recording magnetic pole 2150. To make effective assist, it is necessary to apply, to a medium bit, a high-frequency magnetic field as strong as about 1 KOe. To this end, however, it is necessary to arrange a thick free layer near the medium bit. For instance, in a recording density of about 1 Tb/inch$^2$, it is understood from numerical computation that a free layer (2141) having a thickness of about 30 nm must be arranged at a short distance of 10 nm from the recording medium as shown in FIG. 15. However, in spin torque oscillation unit, since the spin torque exerted on a magnetized free layer is exerted actually only on the boundary portion (with a thickness of several nanometers) of the free layer and a non-magnetic layer, and is not exerted on the other portion of the free layer, it is not easy to drive a thick free layer of several tens nanometers. There is a method for overcoming this problem. In this method, a plurality of spin torque oscillation elements having a thin free layer with a thickness of several nanometers are oscillated with their phases synchronized. As a result, a strong high-frequency magnetic field can be applied to the medium bit.

Figure 16:
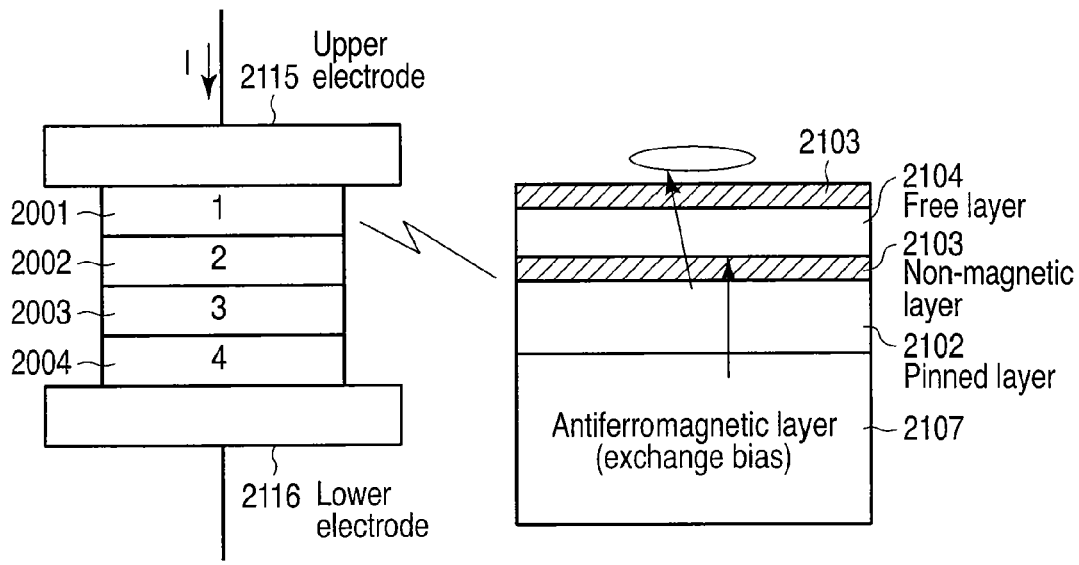
FIG. 16 is a view illustrating a laminated structure example of a four nano-pillar type spin torque oscillation unit.

FIG. 16 shows an example of a spin torque oscillation unit 2120 comprising a plurality (e.g., 4) of nano-pillar type oscillation elements. In FIG. 16, reference numbers 2001 to 2004 denote four oscillation elements. The right portion of FIG. 16 shows the structure of each element. Reference number 2102 denotes a pinned layer, reference number 2103 denotes a non-magnetic layer, reference number 2104 denotes a free layer, and reference number 2107 denotes an antiferromagnetic substance (exchange bias). In this example, the four elements 2001 to 2004 are synchronized in phase via the microwave components of the currents flowing therethrough.

Figure 17:
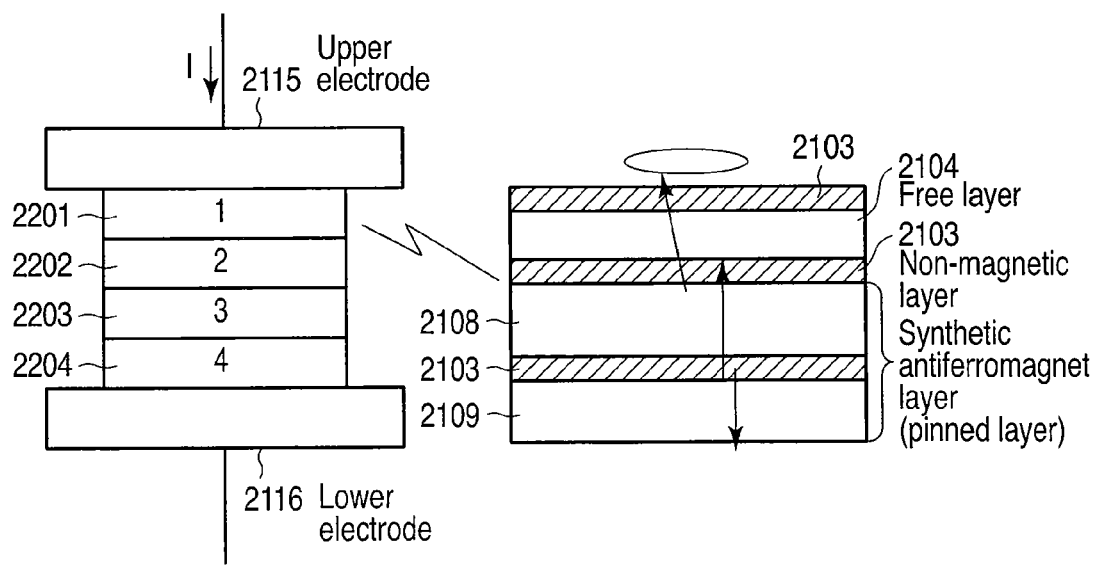
FIG. 17 is a view illustrating a laminated structure example of a spin torque oscillation unit with synthetic antiferromagnetic layers, according to a second embodiment.

FIG. 17 shows an example of an oscillation unit in which the antiferromagnetic layer shown in FIG. 16 is replaced with synthetic antiferromagnetic layers. In FIG. 17, reference numbers 2201 to 2204 denote four oscillation elements. Further, the right portion of FIG. 17 shows the structure of each element. Reference numbers 2108 and 2109 denote synthetic antiferromagnetic layers (pinned layers). Also in this case, the four elements 2201 to 2204 are synchronized in phase via the microwave components of the currents flowing therethrough.

When the laminated structure of FIG. 16 or 17 is driven by, for example, a DC supply (105) as in the case of FIG. 1, the four elements oscillate, synchronized in phase.

Figure 18:
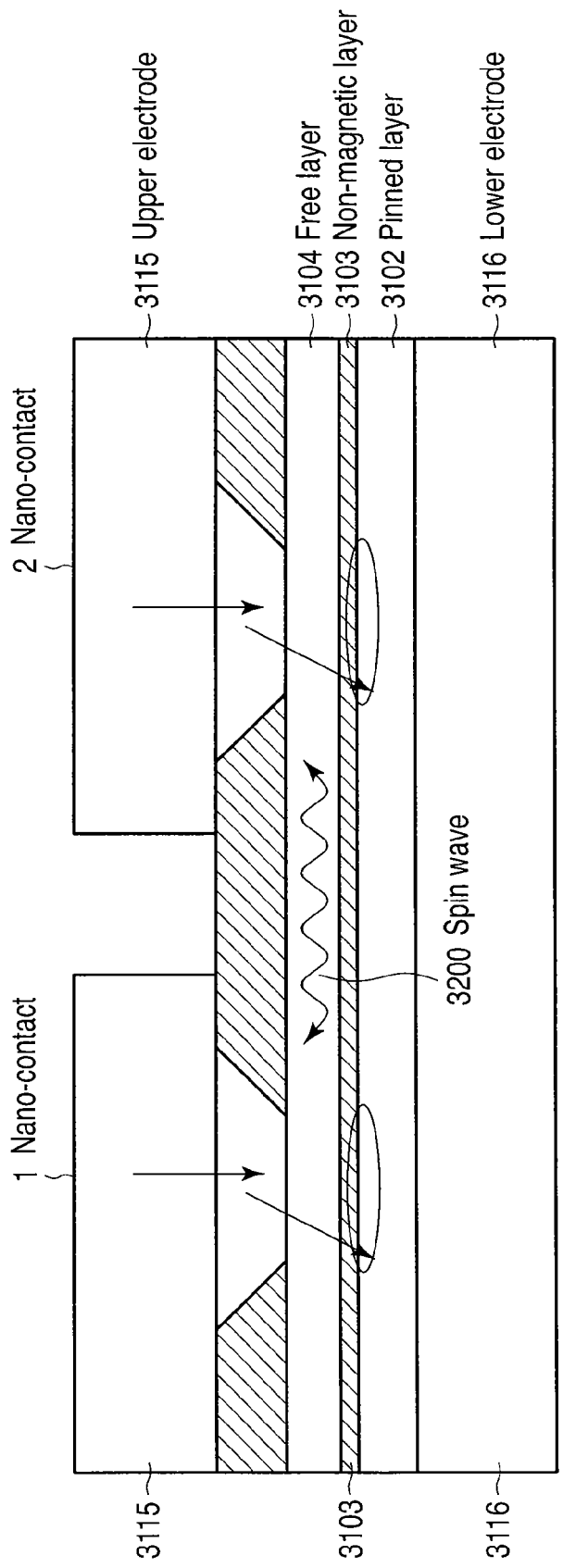
FIG. 18 is a view illustrating a structure example of a spin-wave-coupled nano-contact type spin torque oscillation unit, according to the second embodiment.

FIG. 18 shows another case where a nano-contact type oscillation element. In FIG. 18, reference number 3115 denotes an upper electrode, and reference number 3116 denotes a lower electrode. Since the two nano-contacts (nano-contact 1 and nano-contact 2) interact with each other via a spin wave (denoted by reference number 3200), the two magnetizations, which are just below the two nano-contacts respectively, oscillate with the same phase.

The method of FIG. 16 or 17 is extremely advantageous when oscillation elements of the oscillation unit are TMR type oscillation elements with a great magnetoresistance ratio (MR ratio) since in the method, phase synchronization occurs via microwave currents flowing through oscillation elements of the oscillation unit. alternatively, in the case of a GMR type oscillation element using a metal as a non-magnetic layer and hence having a small MR ratio, it is effective to externally apply a microwave current as well as a DC current, in order to secure phase synchronization. This method is called an injection locking method, and more reliably realizes phase synchronization. Oscillation unit used for microwave assisting require a great magnetic field output, instead of a great power (voltage) output. Therefore, GMR type oscillation elements having a lower resistance and capable of passing therethrough a larger amount of current than TMR type oscillation elements are suitable for microwave assisting. By passing a large amount of current through the GMR type oscillation elements, a large precession of magnetization occurs to thereby increase the high-frequency magnetic field output.

Figure 19:
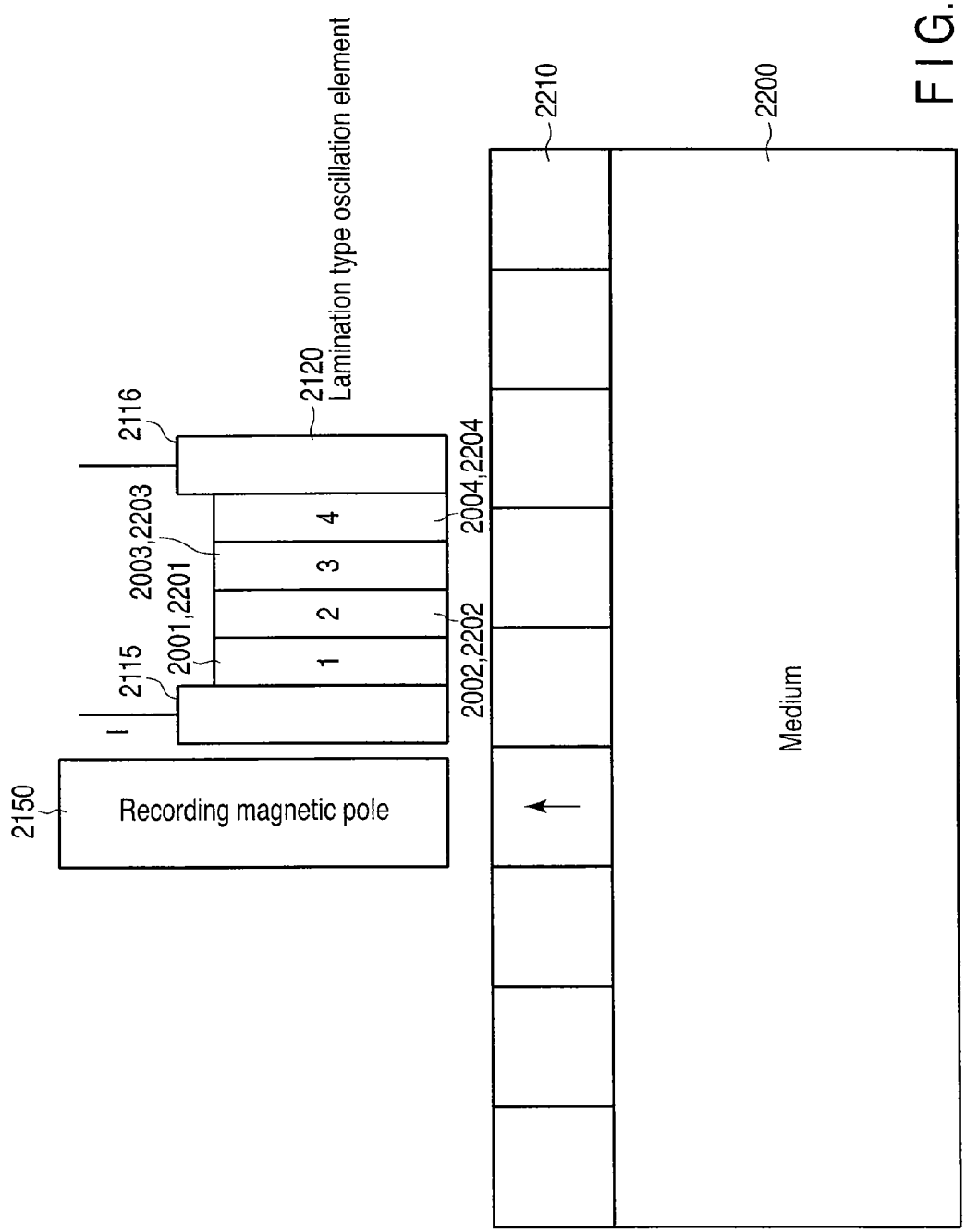
FIG. 19 is a view illustrating a structure example of a recording head using a specific laminated structure spin torque oscillation unit according to the embodiments.

For instance, if the lamination type oscillation unit shown in FIG. 16 or 17 is combined with the recording magnetic pole 2150, the write head shown in FIG. 19 is obtained. This head can easily oscillate, and can apply, to a medium bit, a high-frequency magnetic field of the same strength as an oscillation unit having such a thick free layer as shown in FIG. 15 can apply.

A description will be given of a specific example of a lamination type oscillation unit actually prepared and subjected to a measurement.

A magnetic laminated film formed on a glass substrate by sputtering was processed by electron beams and photolithography to prepare such a four-layer laminated unit as shown in FIG. 17. In this unit, the free layer was made of CoFeB (2 nm), the synthetic antiferromagnetic layer was made of CoFeB (4 nm)/Ru (0.95 nm)/CoFe (4 nm), and the non-magnetic layer was made of Cu (4 nm), and the element size was 40 nm×80 nm.

The oscillation spectra of this unit obtained by applying a DC current by the same circuit as that of FIG. 1 was measured under an external magnetic field of 500 Oe. FIG. 20 shows the measurement results. In FIG. 20, the broad spectrum indicated by (a) was obtained under a current of 0.6 mA, which indicates that four free layers of different oscillation frequencies are not synchronized in phase. When a current was increased to 0.65 mA, such a strong oscillation spectrum of a narrow width as indicated by (b) of FIG. 20 was observed, which indicates that the four free layers synchronously oscillate with the same phase.

As described above, since a spin torque oscillation unit comprising a plurality of oscillation elements synchronized in phase is used in place of a single spin torque oscillator, a strong microwave magnetic field can be applied to a medium bit, thereby enhancing the assisting effect.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic head for use in a three-dimensional magnetic recording/reproducing apparatus, the magnetic head executing a reading from or a writing to a magnetic recording medium, utilizing a magnetic resonance phenomenon of the magnetic recording medium, the magnetic recording medium including a plurality of stacked magnetic layers formed of magnetic substances having different resonance frequencies, each of the stacked magnetic layers including a recording track, comprising:
a spin torque oscillation unit which simultaneously oscillates at a plurality of frequencies to cause the magnetic resonance phenomenon of the magnetic recording medium, when the reading from or the writing to the magnetic recording medium is to be executed; and
auxiliary magnetic poles which assist the spin torque oscillation unit, when the reading from or the writing to the magnetic recording medium is to be executed.

2. The magnetic head according to claim 1, wherein the magnetic head is a read magnetic head, wherein the spin torque oscillation unit is a TMR type oscillation unit.

3. The magnetic head according to claim 1, wherein the magnetic head is a read magnetic head, wherein the spin torque oscillation unit comprises a plurality of spin torque oscillation elements connected in parallel with each other to oscillate with different frequencies.

4. The magnetic head according to claim 1, wherein the magnetic head is a write magnetic head, wherein the spin torque oscillation unit is a CPP-GMR type oscillation unit.

5. The magnetic head according to claim 1, wherein the magnetic head is a write magnetic head, wherein the spin torque oscillation unit comprises a plurality of spin torque oscillation elements connected in series to oscillate with different frequencies.

6. The magnetic head according to claim 1, wherein the spin torque oscillation unit simultaneously oscillates at the plurality of frequencies to execute simultaneous reading or simultaneous writing from or to the recording tracks associated with all or some of the plurality of stacked magnetic layers in accordance with a relationship between each of the plurality of frequencies and each of the resonance frequencies of the plurality of stacked magnetic layers.

* * * * *